US006485856B1

(12) United States Patent
Brown et al.

(10) Patent No.: US 6,485,856 B1
(45) Date of Patent: Nov. 26, 2002

(54) NON-WOVEN FIBER WEBS

(75) Inventors: Karen Leanne Brown, Reading (GB); John Malcolm Gascoyne, High Wycombe (GB)

(73) Assignee: Johnson Matthey Public Limited Company, London (GB)

( * ) Notice: Subject to any disclaimer, the term of this patent is extended or adjusted under 35 U.S.C. 154(b) by 114 days.

(21) Appl. No.: 09/592,494

(22) Filed: Jun. 12, 2000

(30) Foreign Application Priority Data

Jun. 22, 1999 (GB) .............................................. 9914499

(51) Int. Cl.$^7$ .............................. H01M 8/10; B32B 5/16
(52) U.S. Cl. ........................ 429/33; 429/251; 429/304; 429/142; 429/145; 442/417; 442/331; 442/332; 442/348; 442/367
(58) Field of Search ........................ 429/33, 251, 304, 429/142, 145; 442/417, 331, 332, 348, 367

(56) References Cited

U.S. PATENT DOCUMENTS

| 2,731,066 A | 1/1956 | Hogendobler et al. ...... 156/433 |
| 3,282,875 A | 11/1966 | Connolly et al. |
| 4,135,029 A | 1/1979 | Pfeffer |
| 4,329,435 A | 5/1982 | Kimoto et al. |
| 4,330,654 A | 5/1982 | Ezzell et al. |
| 4,358,545 A | 11/1982 | Ezzell et al. |
| 4,417,969 A | 11/1983 | Ezzell et al. |
| 4,433,082 A | 2/1984 | Grot |
| 4,610,762 A | 9/1986 | Birdwell |
| 4,940,525 A | 7/1990 | Ezzell et al. |
| 5,094,995 A | 3/1992 | Butt et al. |
| 5,438,082 A | 8/1995 | Helmer-Metzmann et al. |
| 5,468,574 A | 11/1995 | Ehrenberg et al. |
| 5,547,551 A | 8/1996 | Bahar et al. |
| 5,595,676 A | 1/1997 | Barnes et al. |
| 5,599,639 A | 2/1997 | Sansone et al. |

FOREIGN PATENT DOCUMENTS

| DE | 1 619 026 | 8/1969 |
| EP | 0286945 | 10/1988 |
| EP | 0331321 | 9/1989 |
| EP | 0345964 | 12/1989 |
| EP | 0 731 520 | 9/1996 |
| EP | 0875524 | 11/1998 |
| EP | 0574791 | 12/1998 |
| GB | 0702846 | 1/1954 |
| GB | 0746021 | 3/1956 |
| GB | 1013039 | 12/1965 |
| GB | 1226378 | 3/1971 |
| GB | 1511305 | 5/1978 |
| WO | WO 94/16002 | 7/1994 |
| WO | 94/16134 | 7/1994 |
| WO | WO 95/08581 | 3/1995 |
| WO | WO 95/16730 | 6/1995 |
| WO | WO 97/25369 | 7/1997 |
| WO | 00/23510 | 4/2000 |
| WO | 00/24075 | 4/2000 |

OTHER PUBLICATIONS

European Search Report dated Oct. 11, 2000.
Kolde et al, Electrochemical Society Proceedings, "Advanced Composite Polymer Electrolyte Fuel Cell Membrane" (1995) vol. 95–23, pp. 193–201.
British Patent Office Search Report, dated Oct. 13, 1999, for corresponding Application GB 9914499.0.

*Primary Examiner*—Laura Weiner
(74) *Attorney, Agent, or Firm*—RatnerPrestia

(57) ABSTRACT

A non-woven fibre web comprising a plurality of first fibres of amorphous silica, said first fibres being orientated in the x-, y- and optionally z-direction, and optionally being bonded with one or more binder substances, characterised in that one or more continuous strands are embedded within the non-woven fibre web, each continuous strand comprising one or more second fibres of amorphous silica, and a method for the manufacture thereof is disclosed. Also disclosed is an ion-conducting membrane comprising said non-woven web and the use thereof, in particular, in a fuel cell.

16 Claims, No Drawings

NON-WOVEN FIBER WEBS

The present invention relates to a novel non-woven fibre web with continuous reinforcing strands, a membrane comprising said web and a membrane electrode assembly comprising said membrane, all of which have application in electrochemical devices, for example for use in a fuel cell. The invention further describes a process for the manufacture of the web, membrane and membrane electrode assembly.

Electrochemical cells invariably comprise at their fundamental level a solid or liquid electrolyte and two electrodes, the anode and cathode, at which the desired electrochemical reactions take place. A fuel cell is an energy conversion device that efficiently converts the stored chemical energy of its fuel into electrical energy by combining either hydrogen, stored as a gas, or methanol stored as a liquid or gas, with oxygen to generate electrical power. The hydrogen or methanol is oxidised at the anode and the oxygen is reduced at the cathode of the electrochemical cell. In these cells gaseous reactants and/or products have to be diffused into and/or out of the cell electrode structures. The electrodes therefore are specifically designed to be porous to gas diffusion in order to optimise the contact between the reactants and the reaction sites in the electrode to maximise the reaction rate. The electrolyte which has to be in contact with both electrodes to maintain electrical contact in the fuel cell may be acidic or alkaline, liquid or solid, in nature. The proton exchange membrane fuel cell (PEMFC) is the most likely type of fuel cell to find wide application as a more efficient and lower emission power generation technology in a range of markets including stationary and portable power devices and as alternative to the internal combustion engine in transportation. In the PEMFC, whether hydrogen or methanol fuelled, the electrolyte is a solid proton conducting polymer membrane, commonly based on perfluorosulphonic acid materials.

In the PEMFC the combined laminate structure formed from the membrane and the two electrodes is known as a membrane electrode assembly (MEA). The MEA will typically comprise several layers, but can in general be considered, at its basic level, to have five layers, which are defined principally by their function. On either side of the membrane an anode and cathode electrocatalyst is incorporated to increase the rates of the desired electrode reactions. In contact with the electrocatalyst containing layers, on the opposite face to that in contact with the membrane, are the anode and cathode gas diffusion substrate layers. The anode gas diffusion substrate is designed to be porous and to allow the reactant hydrogen or methanol to enter from the face of the substrate exposed to the reactant fuel supply, and then to diffuse through the thickness of the substrate to the layer which contains the electrocatalyst, usually platinum metal based, to maximise the electrochemical oxidation of hydrogen or methanol. The anode electrocatalyst layer is also designed to comprise some level of the proton conducting electrolyte in contact with the same electrocatalyst reaction sites. With acidic electrolyte types the product of the anode reaction are protons and these can then be efficiently transported from the anode reaction sites through the electrolyte to the cathode layers. The cathode gas diffusion substrate is also designed to be porous and to allow oxygen or air to enter the substrate and diffuse through to the electrocatalyst layer reaction sites. The cathode electrocatalyst combines the protons with oxygen to produce water and is also designed to comprise some level of the proton conducting electrolyte in contact with the same electrocatalyst reaction sites. Product water then has to diffuse out of the cathode structure. The structure of the cathode has to be designed such that it enables the efficient removal of the product water. If water builds up in the cathode, it becomes more difficult for the reactant oxygen to diffuse to the reaction sites, and thus the performance of the fuel cell decreases. In the case of methanol fuelled PEMFCs, additional water is present due to the water contained in the methanol, which can be transported through the membrane from the anode to the cathode side. The increased quantity of water at the cathode requires removal. However, it is also the case with proton conducting membrane electrolytes, that if too much water is removed from the cathode structure, the membrane can dry out and the performance of the fuel cell also decreases.

The complete MEA can be constructed by several methods. The electrocatalyst layers can be bonded to one surface of the gas diffusion substrates to form what is known as a gas diffusion electrode. The MEA is then formed by combining two gas diffusion electrodes with the solid proton-conducting membrane. Alternatively, the MEA may be formed from two porous gas diffusion substrates and a solid proton-conducting polymer membrane catalysed on both sides (hereinafter referred to as a catalyst coated membrane or CCM); or indeed the MEA may be formed from one gas diffusion electrode and one gas diffusion substrate and a solid proton-conducting polymer catalysed on the side facing the gas diffusion substrate.

Conventionally, the solid proton conducting membrane electrolytes used in the PEMFC and other devices are selected from commercially available membranes, for example perfluorinated membranes sold under the trade names Nafion® (E.I. DuPont de Nemours and Co.), Aciplex® (Asahi Chemical Industry) and Flemion® (Asahi Glass KK). For application in the PEMFC the membranes are typically below 200 μm in thickness to provide a high level of ionic conductivity. However, for the advanced, high power density fuel cells, these need to have membranes less than 100 μm thick and preferably less than 50 μm thick. It is also necessary with these membranes that a high level of water is present within the membrane to provide efficient proton hydration and a high proton conductivity. The dimensional changes that occur as the level of water content (hydration) of the membrane changes are a particular problem during fabrication of the MEA as the stresses set up by changes in hydration during the conventionally employed thermal bonding process can be so large as to break the bond between the catalyst and the membrane, or the catalyst and the substrate. Furthermore, the dimensional changes that occur due to the changes in the level of hydration of the membrane lead to considerable difficulties in handling membranes during the fabrication of large area MEAs (for example greater than 500 cm$^2$). The thinner the membrane, the more difficult the handling becomes.

To address these problems composite membrane structures have been prepared. With thicker types of membrane (e.g. >350 μm) developed for other applications, it has been possible to incorporate 'macro' reinforcing materials such as woven polytetrafluoroethylene (PTFE) to minimise such dimensional changes. However, these thicker materials have too low an ionic conductivity to be of use in the PEMFC. U.S. Pat. No. 5,547,551 assigned to W.L. Gore & Associates Inc. describe the fabrication of ultra-thin composite membranes below 25 μm in thickness which comprise incorporating proton conducting polymer material into an expanded porous PTFE membrane. According to Kolde et al., Electrochemical Society Proceedings Vol. 95-23, p193–201

(1995), the composite membrane shows a considerably lower reduction tensile strength on hydration and much improved dimensional stability compared to the conventional non-reinforced membranes. The material has, however, a higher specific resistance (lower ionic conductivity) than an unmodified pure proton conducting membrane such as Nafion® 117 by a factor of at least two.

The higher specific resistance of the above composite membrane means that in practice it has to be much thinner than the equivalent pure proton conducting membrane to maintain the same overall conductivity and thus cell performance. However, reducing the thickness of the composite membrane reduces the advantages that a composite membrane can provide. For example, there is a limit to the extent to which the thickness of the membrane can be reduced since as the membrane is made thinner, the durability and longevity can decrease, and reactant gas cross-over through the membrane is more liable to occur, both of which lead to a reduction in the cell performance. Furthermore, the problems associated with dimensional stability and handlability for MEA fabrication can be exacerbated with thinner membranes. The use of a thermoplastic polymer to produce the composite also means that during MEA fabrication both the ion conducting polymer and the reinforcing polymer will flow under pressure.

E.I. DuPont de Nemours and Co. (WO95/16730) describe a process for making a reinforced substantially non-porous membrane with satisfactory mechanical strength and very low resistance to ionic conduction which approaches that of very thin, unreinforced perfluoro ion exchange polymer membranes. The composite membrane utilises a porous hydrocarbon substrate, such as a polyolefin, and on which at least one side is coated with an ion exchange film formed from a fluorinated polymer. However, again the use of a thermoplastic polymer to produce the reinforcing component of the composite raised the potential for localised thinning as a consequence of plastic flow during MEA fabrication.

For PEMFC's to become commercially viable power sources over a wide range of applications, the membrane will require a manufacturing process capable of producing millions of square metres of material at low cost and able to impart specific structural properties to the material for each application. One recent approach to a composite membrane structure, which does not compromise ionic conductivity and allows the fabrication of thin membranes (200 microns or less) has utilised a porous substrate of non-woven fibres as the matrix into which is embedded an ion conducting polymer (EP 0 875 524 A2). Additional modifications to the structure of the fibre matrix have enabled the characteristics of the final membrane to be more tightly controlled as disclosed in PCT patent applications PCT/GB99/02935 and PCT/GB99/03277. However, to produce membranes in very large volumes requires the development of large volume reel to reel processes, as these offer the most attractive route for the manufacture of the membrane. Consequently it will be necessary for the porous fibre structure to be produced as a continuous sheet of material (a web) which has sufficient strength to be machine processed at relatively high speeds. Typically webs of the type described in the aforementioned applications, because of their open structure, limited thickness and relatively fragile materials of construction, have low tensile strengths. Indeed for many applications, membranes below 100 microns thick are an attractive option with the requirement for a fibre web that is thinner than the final membrane. Hence fibre web thicknesses of 50 microns or less are likely to be required for applications requiring high power density. It is therefore an object of the present invention to overcome the disadvantages of current porous fibre webs for membrane production. A further object of the present invention is to provide a process for the manufacture of the fibre web of the invention, in particular a process that is capable of producing the fibre web in high volumes and with high yields and at low unit cost, and preferably as a single continuous process. A still further object is to provide a process for preparing a membrane in high volumes and with high yields and at low unit cost.

Accordingly, the present invention provides a non-woven fibre web comprising a plurality of first fibres of amorphous silica, said first fibres being orientated in the x-, y- and optionally z-direction, and optionally being bonded with one or more binder substances, characterised in that one or more continuous strands are embedded within the sub-surface layer of the non-woven fibre web, each continuous strand comprising one or more second fibres of amorphous silica.

The amorphous silica for use in the web according to the invention is to be distinguished from crystalline quartz, although there is a tendency in an industrial context for the terms "quartz" and "silica" to be used interchangeably. Although both are chemically silicon dioxide, quartz is the crystalline form and is both hard and brittle, whereas the fibrous materials (the amorphous silica for use in the substrate of the invention) are made from either natural or synthetic quartz, and are amorphous and glass like in character, having no crystalline structure.

The one or more second fibres in the one or more continuous strands may be present as a single fibre, or as a plurality of fibres in the form of a tow or yarn. A tow is an essentially parallel collection of synthetic fibres preparatory to spinning, and a yarn is a continuous twisted strand of two or more fibres. When two or more continuous strands are embedded within the sub-surface layer of the web, the fibre(s) in each continuous strand may be a single fibre, or a plurality of fibres in the form of a tow or yarn, or a combination thereof.

The first fibres are suitably selected from the group consisting of longer fibres and shorter fibres, or a combination of longer and shorter fibres. The longer fibres are of average length greater than 3 mm and suitably have a maximum average length of 50 mm. The preferred average length of the fibres is 5 mm to 30 mm. The diameter of the longer fibres is typically in the range of 0.2 microns to 25 microns, preferably in the range of 2 microns to 20 microns. The shorter fibres have an average length of less than 3 mm, suitably are of average length less than 2 mm, preferably less than 1 mm. The shorter fibres have a minimum length of 50 microns, preferably 100 microns. The diameter of the shorter fibres is typically in the range 0.1 microns to 20 microns, preferably 0.4 microns to 10 microns.

The first fibres in the non-woven fibre web are held together by the one or more binder substances (the "final binder"), which may be a polymeric material or an inorganic metal oxide such as silica. Depending on the binder substance(s) used it may also contribute to the essential membrane properties of the MEA, such as water movement within the membrane. Examples of such binder substances include:

(i) non-ion conducting polymers, (such as polytetrafluoroethylene (PTFE), fluorinated ethylene-propylene (FEP), polyvinylidene difluoride (PVDF), Viton A, polyethylene, polypropylene, ethylene-propylene), (ii) ion-conducting polymers, (such as Nafion®), (iii) colloidal silica, and (iv) other metal oxides and hydroxides, (such as zirconia and titania) or any combination thereof.

The or each continuous strand is embedded within the sub-surface layer of the non-woven fibre web. When more than one continuous strand is present, each continuous strand may be at an equal depth or at varying depths (i.e. variation in the z-direction) or a combination thereof. The continuous strand(s) may be applied at any orientation and at any spacing. The continuous strand(s) may also have applied to the surface of, or impregnated within, the strands a non-ion conducting polymer or polymers or an ion-conducting polymer or polymers or a combination of the two. Examples of such polymers include polytetrafluoroethylene (PTFE), fluorinated ethylene-propylene (FEP), polyvinylidene difluoride (PVDF), Viton A, polyethylene, polypropylene, ethylene-propylene and Nafion®.

The or each continuous strand(s) are made up of one or more second fibres of amorphous silica. The number of fibres in each strand will depend on the required thickness of the web and the application for which it is to be used. The maximum length of the second fibres is determined by the dimensions of the web and the orientation of the continuous strand within the web. For example, the continuous strand may extend from one edge of the web to any one of the other edges, or the continuous strand may extend from one edge of the web to the same edge. In all cases, the length of the second fibre(s) will be dependent on the length of the continuous strand. The diameter of the second fibre(s) is typically in the range of 0.1 to 50 microns, suitably 0.2 microns to 20 microns. The final cross-section profile of the strand(s) within the web will depend on the number and thickness of fibres in the strand and the final thickness of the web.

The non-woven fibre web may be made by a single individual process or by adapting a continuous manufacturing process, such as paper making, to form a continuous web. In both cases the first fibres are dispersed as a suspension in, preferably water, to form a slurry. Also optionally added to the slurry are one or more binder substances (the "first binder"), such as hydrophilic polymers, for example polyvinylalcohol (PVA). The first binder may be in the form of fibres. Once first fibres and the optional first binder are uniformly dispersed in the liquid, the resultant slurry is drained through a suitable mesh in order to form a coherent layer of the non-woven fibre web. In the case of a single individual process the fibres are deposited onto a mesh in a conventional hand sheet maker the deposition process being carried as a series of layers, the continuous strands being introduced onto the required deposited layer so that each strand or group of strands is placed at the desired level within the final sheet. When formed into a continuous structure by the controlled deposition of the slurry onto a moving mesh belt the continuous strands are introduced onto the deposited layer at the appropriate point in the deposition process so that each strand is placed at the desired level within the web. The sheet or web so-formed by either process is dried in an oven to set the first binder. If necessary the sheet or web is placed in a solution of the final binder, which may or may not be the same as the first binder, allowed to dry and optionally heat-treated to set the final binder. If it is not desirable for the first binder to remain in the final web structure, it may be removed by this heat treatment or by an alternative appropriate process. In addition, any undesirable residues may be removed by the heat treatment or by an alternative appropriate process.

A second embodiment of the invention provides an ion-conducting membrane comprising a non-woven web as hereinbefore described and a filler material, characterised in that the filler material comprises an ion conducting polymer.

The ion-conducting membrane of the invention has a final thickness of less than 200 $\mu$m, suitably less than 100 $\mu$m, and preferably less than 50 $\mu$m.

For PEM fuel cell applications, the ion conducting polymer is a proton conducting polymer, examples of such polymers being well known to those skilled in the art. More than one proton conducting polymer may be present and/or a non-ion conducting polymer may also be included in the novel membrane of the invention.

The proton conducting polymers suitable for use in the present invention may include, but are not limited to:

1) Polymers which have structures with a substantially fluorinated carbon chain optionally having attached to it side chains that are substantially fluorinated. These polymers contain sulphonic acid groups or derivatives of sulphonic acid groups, carboxylic acid groups or derivatives of carboxylic acid groups, phosphonic acid groups or derivatives of phosphonic acid groups, phosphoric acid groups or derivatives of phosphoric acid groups and/or mixtures of these groups. Perfluorinated polymers include Nafion®, Flemion® and Aciplex® commercially available from E.I. DuPont de Nemours (U.S. Pat. Nos. 3,282,875; 4,329,435; 4,330,654; 4,358,545; 4,417,969; 4,610,762; 4,433,082 and 5,094,995), Asahi Glass KK and Asahi Chemical Industry respectively. Other polymers include those covered in U.S. Pat. No. 5,595,676 (Imperial Chemical Industries plc) and U.S. Pat. No. 4,940,525 (Dow Chemical Co.)

2) Perfluorinated or partially fluorinated polymers containing aromatic rings such as those described in WO 95/08581, WO 95/08581 and WO 97/25369 (Ballard Power Systems) which have been functionalised with $SO_3H$, $PO_2H_2$, $PO_3H_2$, $CH_2PO_3H_2$, COOH, $OSO_3H$, $OPO_2H_2$, $OPO_3H_2$. Also included are radiation or chemically grafted perfluorinated polymers, in which a perfluorinated carbon chain, for example, PTFE, fluorinated ethylene-propylene (FEP), tetrafluoroethylene-ethylene (ETFE) copolymers, tetrafluoroethylene-perfluoroalkoxy (PFA) copolymers, poly (vinyl fluoride) (PVF) and poly (vinylidene fluoride) (PVDF) is activated by radiation or chemical initiation in the presence of a monomer, such as styrene, which can be functionalised to contain an ion exchange group.

3) Fluorinated polymers such as those disclosed in EP 0 331 321 and EP 0 345 964 (Imperial Chemical Industries plc) containing a polymeric chain with pendant saturated cyclic groups and at least one ion exchange group which is linked to the polymeric chain through the cyclic group.

4) Aromatic polymers such as those disclosed in EP 0 574 791 and U.S. Pat. No. 5,438,082 (Hoechst AG) for example sulphonated polyaryletherketone. Also aromatic polymers such as polyether sulphones which can be chemically grafted with a polymer with ion exchange functionality such as those disclosed in WO 94/16002 (Allied Signal Inc.).

5) Nonfluorinated polymers include those disclosed in U.S. Pat. No. 5,468,574 (Dais Corporation) for example hydrocarbons such as styrene-(ethylene-butylene)-styrene, styrene-(ethylene-propylene)-styrene and acrylonitrile-butadiene-styrene co- and terpolymers where the styrene components are functionalised with sulphonate, phosphoric and/or phosphonic groups.

6) Nitrogen containing polymers including those disclosed in U.S. Pat. No. 5,599,639 (Hoechst Celanese Corporation), for example, polybenzimidazole alkyl sulphonic acid and polybenzimidazole alkyl or aryl phosphonate.

7) Any of the above polymers which have the ion exchange group replaced with a sulphonyl chloride ($SO_2Cl$) or sulphonyl fluoride ($SO_2F$) group rendering the polymers melt processable. The sulphonyl fluoride polymers may form part of the precursors to the ion exchange membrane or may be arrived at by subsequent modification of the ion exchange membrane. The sulphonyl halide moieties can be converted to a sulphonic acid using conventional techniques such as, for example, hydrolysis.

Other non-ion conducting polymeric materials which may be used in addition to the one or more ion conducting or proton conducting polymers include PTFE, FEP, PVDF, Viton® and hydrocarbon types such as polyethylene, polypropylene and polymethylmethacralate.

Other ion-conducting polymeric materials which are not proton conducting polymers may be used in the filler material. For example, such polymers can be used for applications requiring a bipolar membrane or a completely anion exchange membrane. Anion exchange polymers are generally based on quatemary ammonium groups, rather than the fixed sulphonic acid groups in proton conducting polymers. These include, for example, the tetraalkyl ammonium group ($—N^+R_3$) and the quatemary ammonium centre in Tosflex® membranes ($—N(R_1)(CH_2)_yN^+(R_3)$) supplied by Tosoh. However, it can be envisaged that all of the proton exchange polymers described above could have anion exchange equivalents.

The polymer is suitably applied to the non-woven fibre web in the form of a solution, the solvents of which may be either organic or aqueous based. Solvents of all of the above polymers may include or may be modified to include, water, methanol and/or other aliphatic alcohols, ethers, acetone, tetrahydrofuran (THF), n-methylpyrrolidone (NMP), dimethyl sulphoxide (DMSO) dimethyl formamide (DMF) dimethyl acetamide (DMAc) or protonic solvents such as sulphuric acid or phosphoric acid and/or mixtures of the above. However, it has been found that an essentially aqueous solution of the polymer as described in EP 0 731 520 is preferred.

It may also be beneficial to incorporate particulate materials within the membrane to increase either the sites available for proton migration and/or to increase the sites available for holding water within the substrate. Materials such as silica, titanium dioxides, zirconium oxides, zirconium silicates, tungsten oxides, tin oxides and zeolites with a mean particle size of 0.001 $\mu$m to 10 $\mu$m, preferably 0.01 $\mu$m to 5 $\mu$m are examples of suitable particulates which may be used. The particulate material may first be coated, for example, with an ion conducting polymer, a non-conducting hydrophobic or hydrophilic polymer, or a catalyst.

The membranes may be manufactured by taking a non-woven fibre web as hereinbefore described and thereafter applying the polymeric material. This can be done by any number of coating processes such as thin-film casting, dip coating, spraying, printing, rolling, K-bar, or doctor blade methods. Alternatively, a continuous manufacturing process similar to that used to prepare the non-woven fibre web may be used, the filler material being added to the slurry.

The present invention also provides a catalyst coated membrane comprising a membrane as hereinbefore described and a method for the manufacture thereof. A further aspect of the present invention relates to a membrane electrode assembly comprising a membrane as hereinbefore described and a method for the manufacture thereof. A still further aspect of the present invention relates to a fuel cell comprising a membrane as hereinbefore described. Alternatively, the invention relates to a fuel cell comprising a catalyst coated membrane as hereinbefore described. Alternatively, the invention relates to a fuel cell comprising a membrane electrode assembly as hereinbefore described.

The present invention is not limited to the use of the non-woven fibre web or membrane in a fuel cell, and any electrochemical or other device which comprises a web or membrane of the invention is within the scope. Other applications for which one or more of the embodiments of the invention may be used, in addition to fuel cells, include, but are not limited to, metal-an batteries, electrochemical gas sensors, electrochemical reactors for the electrosynthesis of useful chemical compounds and separator mats for batteries. Non-electrochemical applications of the non-woven fibre web include, but are not limited to, composite materials for cryogenic insulation, composite reinforcement in areas such as plastics, cements, printed circuit boards, sports goods etc, for insulation purposes, military applications, automotive structural components, brakes, gaskets, transmission units etc and for filtration applications.

The present invention will now be described by way of example only, which is not intended to be limiting thereof.

COMPARATIVE EXAMPLE 1

A mixture of chopped silica fibres (Type QC9/33-20 mm from Quartz et Silice BP 521-77794 Nemours, Cedex, France) 0.37 g, and silica microfibre (Q fibre, type 104 from Johns Manville, Insulation Group, PO Box 5108, Denver, Colo., USA) 0.18 g were dispersed with mixing, in water (3000 $cm^3$). A porous network was fabricated from the resulting mixture in a single step process based on the principles of paper-making technology, as a sheet size of 855 $cm^2$ (33 cm diameter) in a sheet former (design based on standard SCA Sheet former from AB Lorentzen & Wettre, Box 4, S-163 93 Stockholm, Sweden). The porous fibre sheet was removed from the wire and air dried at 150° C.

COMPARATIVE EXAMPLE 2

A mixture of chopped silica fibres (Type QC9/33-20 mm) 0.37 g, and silica microfibre (Q fibre, type 104) 0.18 g were formed into a sheet as for Comparative Example 1.

The porous fibre sheet was sprayed with a binder solution comprising a 5% solution of Nafion®, 1100 EW in lower aliphatic alcohols (Solutions Technologies Inc., Mendenhall, Pa. 19357, USA) to give a dry Nafion® loading of 0.78 g.

COMPARATIVE EXAMPLE 3

A mixture of chopped silica fibres (Type QC9/33-20 mm) 0.37 g, and silica microfibre (Q fibre, type 104) 0.18 g were formed into a sheet as for Comparative Example 1. The fibre sheet, as formed on the wire and whilst still wet, was sprayed with a binder solution comprising a 20 wt % solution of colloidal silica (Ludox® AS 40; DuPont Speciality Chemicals, Havennummer 500, Wilmington Straat, 2030 Antwerp, Belgium) to give a loading of 0.1 g of the silica. The sheet was removed from the wire and air dried at 150° C.

EXAMPLE 1

A mixture of chopped silica fibres (Type QC9/33-20 mm from Quartz et Silice BP 521-77794 Nemours, Cedex, France) 0.185 g, and silica microfibre (Q fibre, type 104 from Johns Manville, Insulation Group, PO Box 5108, Denver, Colo., USA) 0.09 g were dispersed with mixing, in water (3000 $cm^3$). A porous fibre network was fabricated from the resulting mixture in a single step process as for Comparative Example 1. The porous fibre sheet was left on the wire. A series of straight lengths of silica yarn (Quartzel yarn C9 17Z20 QS13 supplied by Quartz et Silice BP 521-77794 Nemours, Cedex, France) were spaced at 0.5 cm intervals across the surface of the porous fibre sheet using a jig to maintain them in place under tension. The hand sheet maker was carefully refilled with water. A further mixture of chopped silica fibres (Type QC9/33-20 mm) 0.185 g, and silica microfibre (Q fibre, type 104) 0.09 g were dispersed with mixing, in water (3000 cm$^3$), dispersed in the sheet maker and deposited on the existing porous fibre sheet and yarn. The sheet was removed from the wire and air dried at 150° C.

EXAMPLE 2

A porous fibre sheet with silica yarn at 05 cm spacings was formed as in Example 1. The sheet was removed from the wire and air dried at 150° C.

The porous fibre sheet was sprayed with a binder solution comprising a 5% solution of Nafion®, 1100 EW in lower aliphatic alcohols (Solutions Technologies Inc., Mendenhall, Pa. 19357, USA) to give a dry Nafion® loading of 0.78 g.

EXAMPLE 3

A porous fibre sheet with silica yarn at 05 cm spacings was formed as in Example 1. The fibre sheet, as formed on the wire and whilst still wet, was sprayed with a binder solution comprising a 20 wt % solution of colloidal silica (Ludox® AS 40; DuPont Speciality Chemicals, Havennummer 500, Wilmington Straat, 2030 Antwerp, Belgium) to give a loading of 0.1 g of the silica. The sheet was removed from the wire and air dried at 150° C.

Test samples of size 20 mm×100 mm were cut from the sheets prepared in Comparative Examples 1 to 3 and Examples 1 to 3. In the case of Examples 1, 2 and 3 the samples were orientated such that the silica yarn was aligned in the 100 mm length direction. The samples were evaluated for their tensile strength using a Houndsfield H5K-S Materials Testing Machine fitted with soft faced jaws and a 5N load cell for Comparative Examples 1 to 3 and a 100N load cell for Examples 1 to 3. With all of the samples rather than exhibiting a break at the maximum stress (i.e. the tensile strength) the webs tended to show, beyond the maximum stress, elongation and a significant reduction in the stress. This reflected a significant loss in the strength of the web materials due to the untangling of the silica fibres. The relative strength of the samples was, therefore, compared in terms of the maximum stress (i.e. the stress at yield) and the force at which the maximum stress was evident (i.e. the force at yield). The results are presented in Table 1.

TABLE 1

Stress at yield and force at yield for the webs

| Sample | Average Thickness μm | Stress at Yield Pa × 10$^8$ | Force at Yield N |
|---|---|---|---|
| Comparative Example 1 | 30 | 0.06 | 0.035 |
| Comparative Example 2 | 30 | 7.5 | 4.5 |
| Comparative Example 3 | 30 | 1.1 | 0.66 |
| Example 1 | 45 | 19 | 17 |
| Example 2 | 45 | 40 | 36 |
| Example 3 | 45 | 16 | 14 |

A web formed from just a mixture of the chopped and microfine silica as in Comparative Example 1 shows a very low stress and force at yield of 0.06×10$^8$ Pa and 0.035 N respectively. With this strength the web would be far too weak to handle on a reel to reel machine. The incorporation of single lengths of silica yarn at a spacing of 0.5 cm into the structure, as shown by Example 1, results in an increase in the stress and force at yield of over two orders of magnitude to 19×10$^8$ Pa and 17 N respectively. The silica yarn has produced a web that is sufficiently strong to be handleable in a reel to reel process.

As can be seen from Table 1 by comparing Comparative Examples 2 and 3 with Comparative Example 1, the addition of Nafion or silica binders to the web does result in a significant increase in the stress and force at yield. However, the strength of the webs with the binders is still too low to envisage handling them in a reel to reel process. The inclusion of silica yarn into the webs containing the binders produces, however, a further significant improvement in the stress and force at yield. With Nafion binder Comparative Example 2 shows a stress and force at yield of 75×10$^8$ Pa and 4.5 N respectively. The addition of silica yarn to this web in Example 2, at a spacing of 0.5 cm, increases the stress and force at yield to 40×10$^8$ Pa and 36 N respectively. Correspondingly, in Comparative Example 3, with silica binder the web shows a stress and force at yield of 1.1×10$^8$ Pa and 0.66 N respectively. The addition of silica yarn to this web in Example 3, at a spacing of 0.5 cm, increases the stress and force at yield to 16×10$^8$ Pa and 14 N respectively. These increases in the strength of the webs containing the binders, by the addition of silica yarn, results in the production of webs that are sufficiently strong to be suitable for use in the reel to reel processes that are commonly employed in volume manufacture.

What is claimed is:

1. An ion-conducting membrane comprising:
   a non-woven fiber web comprising a plurality of first fibers of amorphous silica and at least one continuous strand, wherein the first fibers are orientated in either the x- and y-direction or the x-, y- and z-direction, wherein the at least one continuous strand is embedded within the non-woven fiber web and each continuous strand of the at least one continuous strand comprises at least one second fiber of amorphous silica; and
   a filler material comprising an ion-conducting polymer.

2. A membrane according to claim 1 wherein the ion-conducting polymer is a proton conducting polymer.

3. A membrane according to claim 1, wherein the filler material further comprises a non-ion-conducting polymer.

4. A membrane according to claim 1, wherein the filler material further comprises at least one particulate material.

5. A membrane according to claim 4, wherein the at least one particulate material is first coated with an ion-conducting polymer, a non-ion-conducting hydrophobic or hydrophilic polymer, or a catalyst.

6. A catalyst coated membrane comprising a membrane according to claim 1.

7. A fuel cell comprising a catalyst coated membrane according to claim 6.

8. A membrane electrode assembly comprising a membrane according to claim 1.

9. A fuel cell comprising a membrane electrode assembly according to claim 8.

10. A fuel cell comprising a membrane according to claim 1.

11. A membrane according to claim 1, wherein the at least one continuous strand comprises a plurality of continuous strands which are embedded within the web at equal or varying depths or a combination thereof.

12. A membrane according to claim 1, wherein the at least one continuous strand has a polymer applied to the surface of or impregnated within the strand.

13. A membrane according to claim 1, wherein a diameter of the at least one second fiber is in the range of 0.1 microns to 50 microns.

14. A membrane according to claim 1, wherein the first fibers are selected from the group consisting of longer fibers having an average length greater than 3 mm and shorter fibers having an average length less than 3 mm.

15. A membrane according to claim 1, wherein the first fibers are bonded with at least one binder substance.

16. A membrane according to claim 15, wherein the at least one binder substance is selected from the group consisting of a non-ion-conducting polymer, silica, colloidal silica, a metal oxide, a metal hydroxide, and combinations thereof.

* * * * *